(12) United States Patent
Dobyns et al.

(10) Patent No.: US 7,532,492 B2
(45) Date of Patent: May 12, 2009

(54) HOST CONTROLLED VOLTAGE INPUT SYSTEM FOR AN ACCESSORY DEVICE

(75) Inventors: Kenneth P. Dobyns, Beaverton, OR (US); Michael J. Mende, Portland, OR (US); Richard A. Van Epps, Vancouver, WA (US); Michael D. Stevens, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 504 days.

(21) Appl. No.: 11/314,357

(22) Filed: Dec. 20, 2005

(65) Prior Publication Data

US 2007/0143638 A1 Jun. 21, 2007

(51) Int. Cl.
*H02M 3/18* (2006.01)
*H02M 7/00* (2006.01)

(52) U.S. Cl. ................ 363/59; 324/426; 324/437
(58) Field of Classification Search ............ 324/426, 324/436, 437; 363/59; 370/451
See application file for complete search history.

(56) References Cited

U.S. PATENT DOCUMENTS

| | | | |
|---|---|---|---|
| 4,402,055 A | 8/1983 | Lloyd et al. | |
| 4,455,654 A | 6/1984 | Bhaskar et al. | |
| 4,600,010 A | 7/1986 | Dugot | |
| 4,672,306 A | 6/1987 | Thong | |
| 4,708,661 A | 11/1987 | Morland et al. | |
| 4,868,822 A | 9/1989 | Scott et al. | |
| 5,162,725 A | 11/1992 | Hodson et al. | |
| 5,184,066 A | 2/1993 | McEachern et al. | |
| 5,317,697 A | 5/1994 | Husak et al. | |
| 5,530,302 A | 6/1996 | Hamre et al. | |
| 5,589,719 A | 12/1996 | Fiset | |
| 5,691,635 A | 11/1997 | Pot et al. | |
| 5,714,809 A | 2/1998 | Clemo | |
| 5,757,672 A | 5/1998 | Hoepken | |
| 5,761,214 A | 6/1998 | Ford et al. | |
| 5,784,576 A | 7/1998 | Guthrie et al. | |
| 5,815,647 A | 9/1998 | Buckland et al. | |
| 5,857,866 A | 1/1999 | Felps | |
| 5,862,146 A | 1/1999 | Chen et al. | |
| 5,875,310 A | 2/1999 | Buckland et al. | |
| 5,910,690 A | 6/1999 | Dorsey et al. | |
| 5,939,875 A | 8/1999 | Felps et al. | |
| 5,983,298 A | 11/1999 | Schultz et al. | |
| 6,008,550 A | 12/1999 | Dorsey et al. | |
| 6,026,458 A | 2/2000 | Rasums | |
| 6,118,293 A | 9/2000 | Manhaeve et al. | |
| 6,137,280 A * | 10/2000 | Ackermann et al. | ......... 323/354 |
| 6,232,764 B1 | 5/2001 | Rettig et al. | |
| 6,339,338 B1 | 1/2002 | Eldridge et al. | |
| 6,351,112 B1 | 2/2002 | Felps et al. | |
| 6,385,550 B1 | 5/2002 | Jansen et al. | |

(Continued)

*Primary Examiner*—Akm E Ullah
*Assistant Examiner*—Arun Williams
(74) *Attorney, Agent, or Firm*—William K. Bucher (57) ABSTRACT

An accessory device voltage management system includes an accessory device selectively coupled to a host. The host provides a bulk power supply and a low power supply voltage to the accessory device. The host receives accessory device parameters from the device and determines if the accessory device is a valid and supported device and, if so, sends commands to the accessory device to couple the bulk power supply voltage to a power supply circuit in the accessory device. The power supply circuit in the accessory device generates at least a first regulated voltage output.

9 Claims, 5 Drawing Sheets

U.S. PATENT DOCUMENTS

| | | |
|---|---|---|
| 6,452,411 B1 | 9/2002 | Miller et al. |
| 6,456,103 B1 | 9/2002 | Eldridge et al. |
| 6,601,179 B1 | 7/2003 | Jackson et al. |
| 6,629,048 B1 | 9/2003 | Law et al. |
| 6,651,178 B1 | 11/2003 | Voegeli et al. |
| 6,760,850 B1 | 7/2004 | Atkinson et al. |
| 6,829,547 B2 | 12/2004 | Law et al. |
| 2002/0036515 A1 | 3/2002 | Eldridge et al. |
| 2004/0151201 A1* | 8/2004 | Dandy et al. ................. 370/451 |
| 2004/0251907 A1* | 12/2004 | Kalley ......................... 324/426 |
| 2005/0057256 A1* | 3/2005 | Bertness ...................... 324/426 |
| 2005/0099185 A1* | 5/2005 | Klang .......................... 324/426 |
| 2006/0284617 A1* | 12/2006 | Kozlowski et al. ........... 324/426 |

* cited by examiner

HOST CONTROLLED VOLTAGE INPUT SYSTEM FOR AN ACCESSORY DEVICE

BACKGROUND OF THE INVENTION

The present invention relates generally to providing a voltage to an accessory device and more particularly to an accessory device voltage management system controlled by a host.

A typical measurement probe for acquiring electrical signals from a device under test has a probing head connected to a termination/control box via a transmission cable, such as a coaxial cable. The probing head may be for acquiring voltage or current signals. The probing head has passive and/or active circuitry for conditioning the acquired signal prior to coupling the signal to the termination/control box. The termination/control box has a coaxial signal connector, such as a BNC type connector, and may include power, clock and data connectors for connecting the measurement probe to a measurement test instrument, such as an oscilloscope or the like.

U.S. Pat. No. 6,629,048 B1 teaches a measurement test instrument and associated voltage management system for an accessory device having an accessory device interface that provides a voltage to a memory device in the accessory device. The memory device stores data related to the accessory device, such as the accessory type, power and/or voltage requirements of the accessory and the like. A sensing circuit receives a sensing signal from the accessory device when it is connected to the interface. The sensing circuit generates an interrupt signal that is coupled to a controller. The controller initiates the generation of a clock signal that is coupled to the accessory device through the interface to retrieve accessory device data stored in the device memory. The controller determines if the connected accessory device is a valid device capable of being supported by the measurement test instrument. The controller generates an enable signal for a valid and supported device that is coupled to a voltage switching circuit. The voltage switching circuit generates one or more output voltages that are coupled to the accessory device via the interface to provide power to the accessory device.

U.S. Pat. No. 6,829,547 B1 teaches another measurement test instrument and associated voltage management system for an accessory device. The structure of the accessory device interface is substantially similar to the '048 patent with the accessory device having an memory device for storing accessory data. The measurement test instrument controller functions in a similar manner to the '048 patent to determine if the connected accessory device is a valid device capable of being supported by the measurement test instrument and identifies the voltage requirements for the accessory device. The controller generates an enable signal for a valid and supported device and at least a first voltage code for the identified voltage requirement. A voltage switching circuit receives the enable signal and the voltage code and generates one or more output voltages having the identified voltage requirement that are coupled to the accessory device via the interface to provide power to the accessory device.

The above described voltage management systems require a voltage switching circuit for each interface of the measurement test instrument. Further, each interface requires a sufficient number of interface contacts for coupling the output voltages from the voltage switching circuit to the accessory device. This increases the complexity and cost of the measurement test instrument as well as increasing the cost and complexity of the accessory and measurement test instrument interface. What is needed is an accessory device voltage management system that reduces the cost and complexity of the voltage management system and the interface between the accessory device and the measurement test instrument or host.

SUMMARY OF THE INVENTION

Accordingly, the present invention is directed to an accessory device voltage management system having an accessory device, a host and an accessory device interface. The accessory device has a controller coupled to a memory device storing parameters of the accessory device. A communication bus, and an interrupt line are also coupled to the controller. The accessory device further includes a power supply coupled to the accessory device interface via a switch that is controlled by the accessory device controller. The power supply generates at least a first regulated voltage output. The host has a power supply generating a bulk power supply output and a low power supply output, and a controller coupled to a communications bus and an interrupt line. The accessory device interface has a first portion disposed in the host and a second portion disposed in the accessory device with the interface having mating contacts. The contacts couple the bulk power supply output and the low power supply output from the host to the accessory device, couple a ground connection from the host to the accessory device and couple the communications bus of the accessory device to the communication bus of the host.

The host controller receives an interrupt signal from the accessory device on the interrupt line when the accessory device is coupled to the host via the accessory device interface. The host controller communicates with the accessory device via the host and accessory device communications busses to retrieve accessory device parameters stored in the accessory device memory to determine if the accessory device is a valid device and supported by the host. The controller initiates communications with the accessory device controller for coupling the bulk power supply of the host to the power supply of the accessory device via the switching element.

The communications bus may be any form of bi-directional communications bus architecture, such as an $I^2C$ bus, IEEE 1494 bus, USB bus or the like. The accessory device power supply preferably generates a plurality of regulated voltage outputs for providing regulated voltages to additional accessory device circuits or devices coupled to the accessory device. The switching element for coupling the bulk supply voltage from the host to the accessory power supply is preferably an electronic switch. The accessory device may be any type of transduce device or general accessory device requiring voltage power for operation, such as a measurement probe, measurement probe adapter, active filter devices, video or thermal camera, thermal detector, probe calibration fixture, probe isolation accessory, serial data acquisition system or the like. The host may be a measurement instrument, such as an oscilloscope, logic analyzer, spectrum analyzer or similar such devices having an accessory device interface for accepting an accessory device.

The accessory device voltage management system may further include a plurality of accessory devices with each accessory device having a power supply that generates at least a first regulated voltage output, a memory storing parameters of the accessory device including a power draw parameter, a controller coupled to the memory, a communication bus and an interrupt-line coupled to the controller, and a switching element controlled by the controller. The host has a power supply generating a bulk power supply output and a low power supply output, and a controller coupled to the a communications bus having a clock line and a plurality of data lines and a plurality of interrupt lines with the host having a power budget parameter. A plurality of accessory device interfaces are provided with each accessory device interface having a first portion disposed in the host and a second portion disposed in one of the plurality of accessory devices. Each of the plurality of accessory device interfaces has mating contacts for coupling the bulk power supply output and the low power supply output from the host to the accessory device, coupling a ground connection from the host to the accessory device and coupling the communications bus of the accessory device to the communication bus of the host.

The host controller receives the interrupt signals from the plurality of accessory devices on the interrupt lines when the accessory devices are coupled to the host via the accessory device interfaces. The host controller communicates with the accessory devices via the host and accessory devices communications busses to retrieve the accessory devices parameters stored in the accessory devices memories to determine if the accessory devices are valid devices and supported by the host, and total power draw parameters of the plurality of accessory devices are less than the host power budget parameter. The controller initiates communications with the accessory devices controllers for coupling the bulk power supply of the host to the power supplies of the accessory devices via the respective switching elements of the plurality of accessory devices when the accessory devices are valid devices and supported by the host, and total power draw parameters of the plurality of accessory devices are less than the host power budget parameter.

The objects, advantages and novel features of the present invention are apparent from the following detailed description when read in conjunction with appended claims and attached drawings.

DETAILED DESCRIPTION OF THE PREFERRED EMBODIMENT

Figure 1:
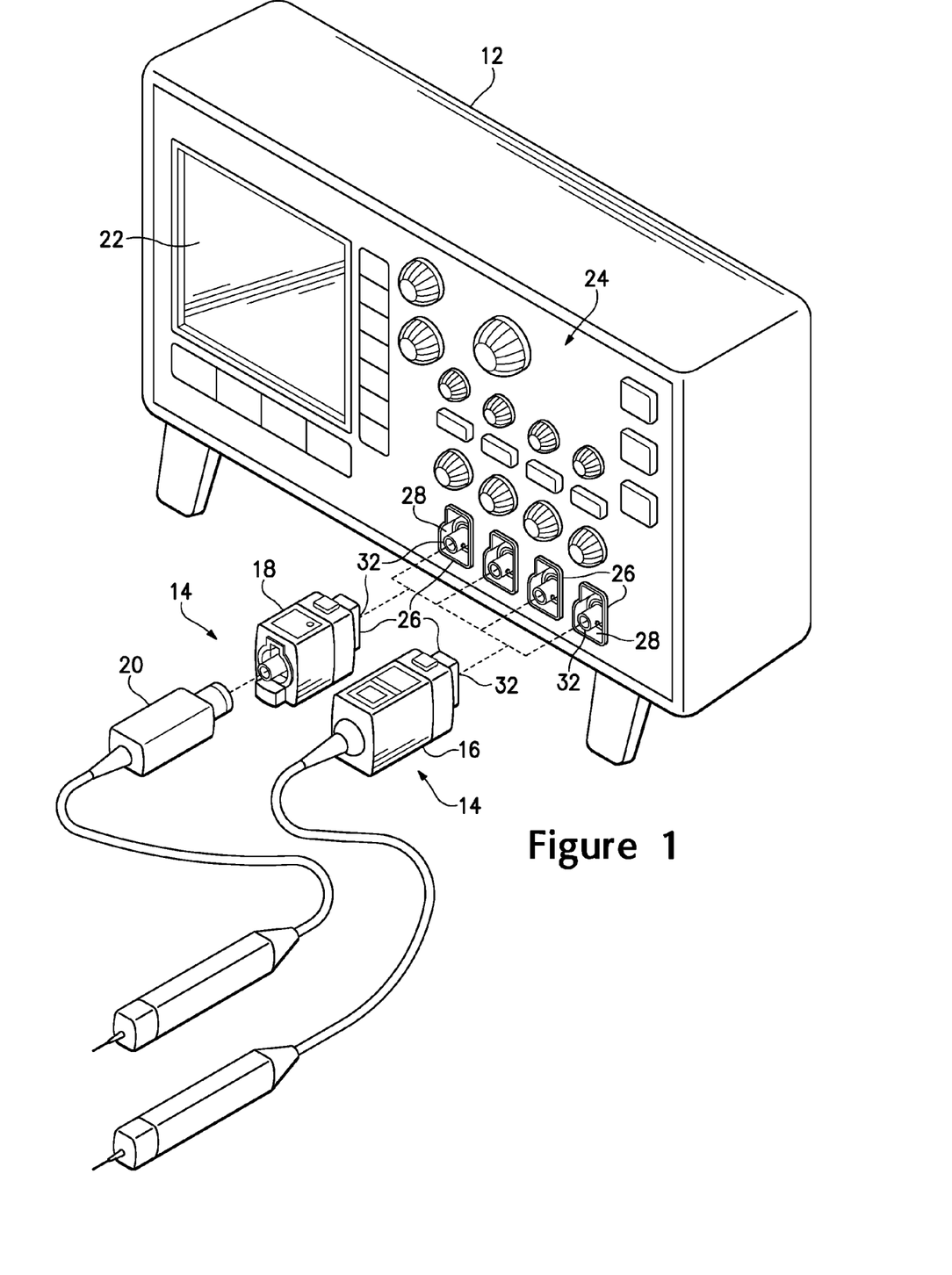
FIG. 1 is a perspective view of a representative host and accessory device incorporating the accessory device voltage management system.

Referring to FIG. 1, there is shown a perspective view of a host 12 and accessory device 14 having an accessory device voltage management system. The host 12 is representatively shown as a measurement test instrument, such as an oscilloscope. The host may be other type of measurement test instruments, such as a logic analyzer, spectrum analyzer and the like, or other types of host devices that provide power to an accessory device. The accessory device 14 is representatively shown as a measurement probe 16 or measurement probe adapter 18 that receives a measurement probe 20. The measurement probes 16 and 20 may be passive or active voltage probes, current probes or the like. The accessory device 14 may also be a video or thermal camera, optical-to-electrical converter, active pre-filter or other transducer devices or general accessory device requiring power from the host 12, such as a calibration fixture, probe isolation accessory, serial data acquisition system or the like.

Figure 2A:
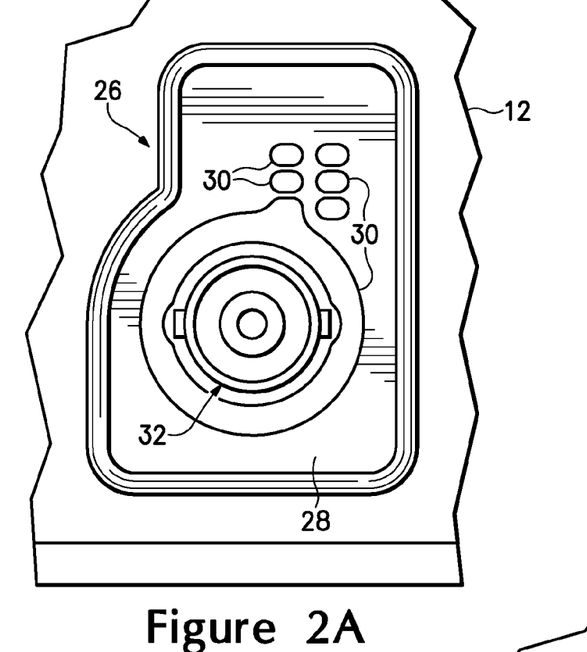
FIGS. 2A and 2B illustrate an example of a electrical/mechanical accessory device interface for the accessory device voltage management system.

The host 12 may include a display 22, front panel controls 24, such as push buttons, rotatable knobs and the like coupled to circuitry within the host 12. The host 12 further includes a first portion of at least a first accessory device interface 26 with the accessory device 14 having the other portion of the accessory device interface 26. The host portion of the accessory device interface 26 has a pocket 28 in which are disposed electrical contact pads 30 as shown more clearly in FIG. 2A. The electrically conductive contact pads 30 are coupled to circuitry within the host 12. The host portion of the accessory device interface 26 preferably has one side of a coaxial connector 32 for coupling acquired signal to the host 12.

Figure 2B:
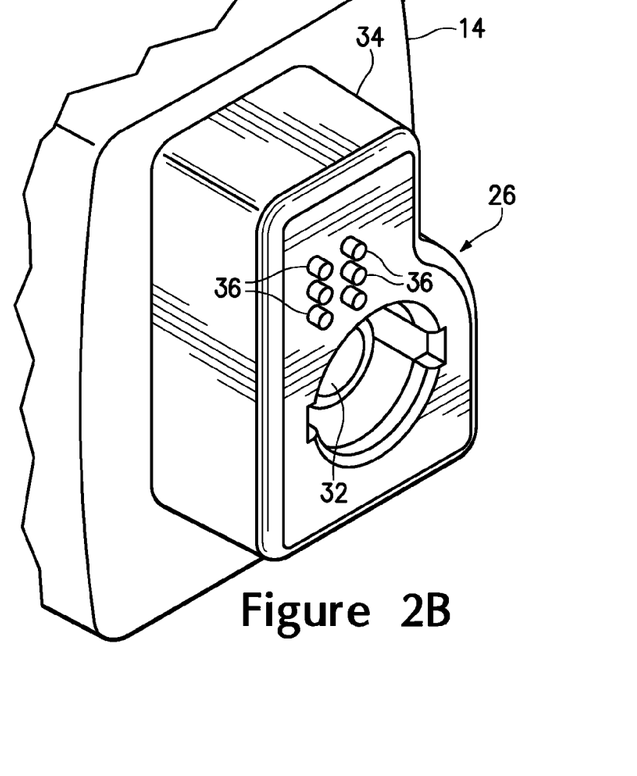

The accessory device portion of the accessory device interface 26, as shown more clearly in FIG. 2B, has a protruding body 34 extending from the accessory device 14 having spring-loaded electrical contacts 36 that mate with the electrical contact pads 30 of the host portion of the accessory device interface 26. The spring-loaded electrical contacts 36 are coupled to circuitry within the accessory device 14. The accessory device portion of the accessory device interface 26 has the other side of the coaxial connector 32 that mates with the coaxial connector portion 32 in the host portion of the accessory device interface 26.

Figure 3:
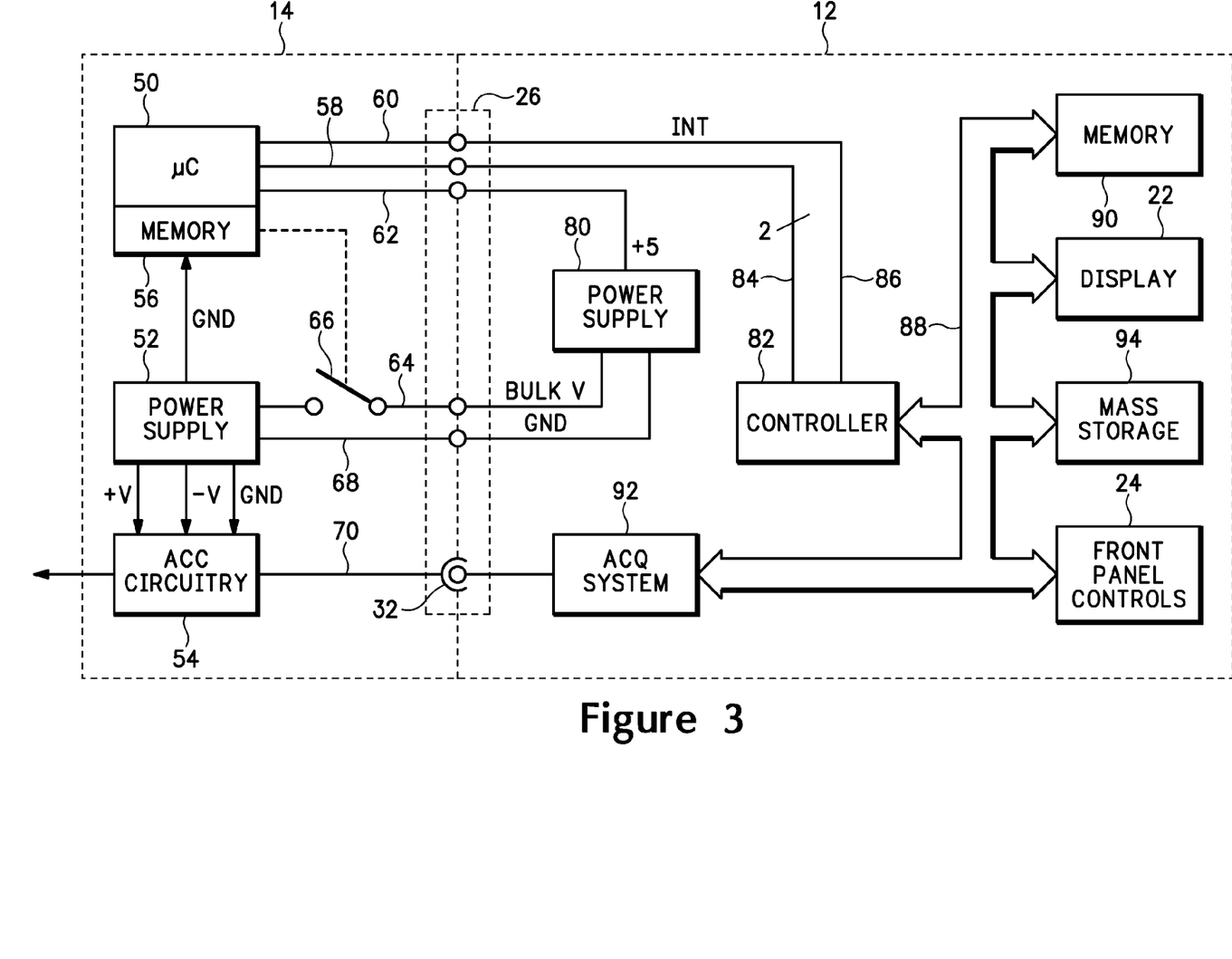
FIG. 3 is a representative block diagram of one embodiment of the accessory device voltage management system.

Referring to FIG. 3, there is shown a representative block diagram of the accessory device voltage management system. The accessory device 14 has a controller 50, a power supply circuit 52 and accessory device circuitry 54. The accessory device controller 50 may include an embedded memory 56 or a separate memory device coupled to the controller 50. The accessory device controller 50 has a communications bus 58, such as an I²C bus, IEEE 1494 bus, USB bus or the like, that provides bi-directional communications. Preferably the communications bus includes a clock line and a data line coupled to the accessory device interface 26. The accessory device controller 50 also has an interrupt line 60 coupled to the accessory device interface 26. A low power supply voltage is provided to the accessory device controller 50 and memory 56 via a low voltage supply line 62 coupled to the accessory device interface 26. A bulk voltage is provided to the accessory device power supply circuit 52 via a bulk voltage supply line 64 coupled to the accessory device interface 26. A switch 66 is disposed in the bulk voltage supply line 64 and is activated by commands sent by the accessory device controller 50. Preferably, the switch 66 is an electronic switch but other types of switches may be used, such a electro-mechanical switches and the like. A ground line 68 coupled to the accessory device interface 26 provides electrical ground to the accessory device 14.

The accessory device circuitry 54 receives at least a first regulated voltage supply from the accessory device power supply 52. Preferably, the accessory device power supply 52 provides a variety of voltages to the accessory device circuitry 54 depending on the voltage requirements of the circuitry. For example, the accessory device power supply may provide ±7 volts, ±15 volts, ±25 volts or any set of voltages required by the accessory device circuitry 54. The regulated voltages provided to the accessory device circuitry 54 are by example only and other voltage levels may be provided without departing from the scope of the present invention. The accessory device circuitry 54 is preferably coupled to receive acquired signal from a device under test via the measurement probing head of the measurement probes 16 and 20. The acquired signal is coupled via signal line 70 to the coaxial connector 32 of the accessory device interface 26.

The host 12 has a power supply 80 providing a bulk power supply output to the power supply circuit 52 of the accessory device 14 via accessory device interface 26 and the switch 66. The bulk power supply output is a slightly regulated voltage that preferably ranges from +10 to +14 volts with a nominal voltage of +12 volts. Other voltage levels may be employed without departing from the scope of the invention. The power supply 80 also generates a low power supply output, generally +5 volts, that is provided to the accessory device controller 50 and memory 56 through the accessory device interface 26. The host 12 has a controller 82 that is coupled to a communications bus 84 and an interrupt line 86. The communications bus 84 and interrupt line are coupled to the accessory device interface 26. The communications bus 84 provides bi-directional communications with the accessory device 14 and may take the form of an $I^2C$ bus, IEEE 1494 bus, USB bus or the like. Preferably the communications bus 84 includes a clock line and a data line coupled to the accessory device interface 26.

The host controller 82 is coupled via a system bus 88 to memory 90. The memory 90 represents both RAM, ROM and cache memory with the RAM memory storing volatile data, such as digital data samples of an input signal generated by an acquisition system 92 coupled to receive the acquired signal from the accessory device 14. The system bus 88 is also connected to the display device 22, such as a liquid crystal display, cathode ray tube or the like, and to the front panel controls 24 which may include control entry devices, such as a keyboard and/or mouse as well as the knobs and buttons. A mass storage unit or units 94, such as a hard disk drive, CD ROM drive, tape drive, floppy drive or the like that reads from and/or writes to appropriate mass storage media, may also be connected to the system bus 88. Program instructions for controlling the host 12 and implementing the accessory device voltage management system may be stored and accessed from the ROM memory 90 or from the mass storage media of the mass storage unit 94. The controller 82 in the above described host 12 may also be implemented using multiple controllers and digital signal processing devices. For example, a second controller, such as a Power PC microprocessor manufactured and sold by Motorola, Inc., Schaumburg, Ill., may be included to control the acquisition and processing of the acquired signal. The display device 22 may be controlled by a display controller receiving display instructions from a host controller 82 and receiving display data from a digital signal processing device. A bus controller may also be included to monitor the accessory device interface 26 for connected accessory devices 14, and provide communications between the accessory device interface 26 and the controller 82.

The accessory device voltage management system operates to provide a bulk power supply voltage from the host 12 to the accessory device 14 when a valid and supported accessory device is determined by the host 12. When the accessory device 14 is coupled to the host 12 via the accessory device interface 26, an interrupt signal is generated by the accessory device controller 50 and coupled to the host controller 82 via the accessory device interrupt line 60, the accessory device interface 26 and the host interrupt line 86. The interrupt signal causes the host controller 82 to activate the communications bus 84 which couples a clock signal to the accessory device controller 50 via the host communication bus 84, the accessory device interface 26 and the accessory device communication bus 58. The clock signal received by the accessory device controller 50 causes the accessory device parameters to be, read out of the memory 56. The accessory device parameters may include but are not limited to the accessory device type, serial number, a power draw requirement and the like. The accessory device parameters are coupled by the accessory device and host communications busses 58 and 84 data lines to the host controller 82. The host controller 82 operating under program control verifies that the connected accessory device 14 is valid and supported by the host 12. Once the host controller 82 determines that the accessory device 14 is valid and supported, it initiates command signals that are coupled via the communications buses 84 and 58 to the accessory device controller 50. The accessory device controller 50 interprets the host controller 82 commands signals to activate the switch 66 in the bulk voltage supply line 64. The switch 66 closes and couples the bulk power supply voltage to the accessory device power supply 52.

Figure 4:
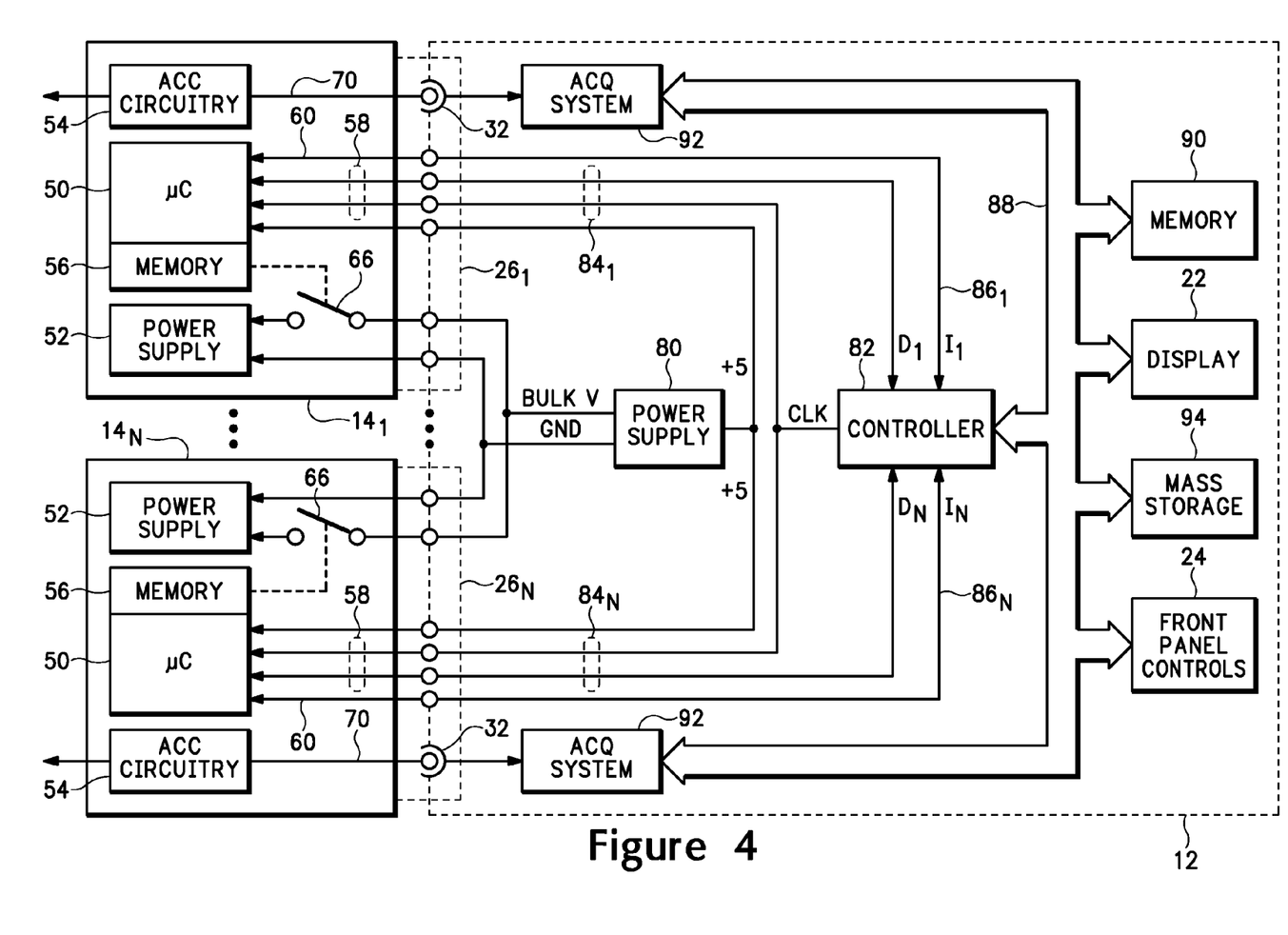
FIG. 4 is a representative block diagram of a further embodiment of the accessory device voltage management system incorporating multiple accessory devices.

Referring to FIG. 4, there is shown a block diagram further embodiment of the accessory device voltage management system. Like elements from the previous drawing are labeled the same. The drawing of FIG. 4 shows multiple accessory devices $14_1$ through $14_n$ coupled to respective accessory device interfaces $26_1$ through $26_n$ wherein "n" represents any number of accessory devices and accessory device interfaces. Each of the accessory devices $14_1$ through $14_n$ have a controller 50 and memory 56, a power supply circuit 52 and accessory device circuitry 54. Each accessory device $14_1$ through $14_n$ has a communications bus 58 and an interrupt line 60. Each accessory device $14_1$ through $14_n$ is provided with a low power supply voltage, a bulk supply voltage through a switch 66 and a ground connection. Each accessory device $14_1$ through $14_n$ is provided with a signal line 70 for coupling an acquired signal to the coaxial connector 32 of one of the accessory device interfaces $26_1$ through $26_n$.

The host power supply 80 provides the low power supply voltage and the bulk power supply voltage to each of the respective accessory devices $14_1$ through $14_n$ through the accessory device interfaces $26_1$ through $26_n$. The host controller 82 has interrupt lines $86_1$ through $86_n$ with each of the interrupt lines coupled to one of the accessory device interfaces $26_1$ through $26_n$. The host controller 82 has communications busses $84_1$ through $84_n$ that are coupled to each of the respective accessory device interfaces $26_1$ through $26_n$. Each communications bus $26_1$ through $26_n$ has a clock line receiving a common clock signal and separate data lines $D_1$ through $D_n$ coupled to the host controller 82. The host 12 also has a power budget parameter value that is stored in memory 90 or in the host controller 82 that contains information on the maximum amount of bulk power supply voltage power available from the power supply 80.

The accessory device voltage management system for a plurality of accessory devices $14_1$ through $14_n$ operates in a similar manner to the previously described system. When one of the accessory devices $14_1$ through $14_n$ is plugged into one of the accessory device interfaces $26_1$ through $26_n$, an interrupt signal is generated. by the accessory device controller 50 and coupled via the accessory device interface $26_1$ to the host controller 82 over one of the interrupt lines $86_1$ through $86_n$. The host controller 82 activates the clock signal that is coupled to the accessory device $14_1$ via the accessory device interface $26_1$. The accessory device controller 50 receives the clock signal and clocks the accessory device parameter data back to the host controller 82 over the data line $D_1$. The host controller 82 verifies that the attached accessory device $14_1$ is a valid and supported device and compares the power draw requirement of the accessory device $14_1$ with the power budget parameter for the power supply 80 to determine if sufficient bulk power supply power is available. Once the host controller has determined that the accessory device $14_1$ is a valid and supported device and there is sufficient bulk power supply power available, the host controller initiates command signals that are coupled via the communications bus $84_1$ though the accessory device interface $26_1$ and the communications bus 58 of the accessory device $14_1$ to the accessory device controller 50. The accessory device controller interprets the host controller 82 command signals to activate the switch 66 in the accessory device $14_1$ to couple the bulk power supply voltage to the accessory device power supply 52.

When another accessory device $14_n$ is plugged into an accessory device interface $26_n$, the accessory device controller generates an interrupt signal that is coupled to the host controller 82 via the accessory device interface $26_n$ and the interrupt line $86_n$. The host controller 82 activates the clock-signal that is coupled to the accessory device $14_n$ via the accessory device interface $26_n$. The accessory device controller 50 receives the clock signal and clocks the accessory device parameter data back to the host controller 82 over the data line $D_n$. The host controller 82 verifies that the attached accessory device $14_n$ is a valid and supported device. The host controller 82 adds the power draw parameter of the accessory device $14_n$ to the power draw parameter for the accessory device $14_1$ and compares the summed power draw value with the power budget parameter for the power supply 80. If the summed power draw parameter value is less that the power budget parameter and the accessory device $14_n$ is a valid and supported device, the host controller 82 initiates command signals that are coupled via the communications bus $84_n$ though the accessory device interface $26_n$ and the communications bus 58 of the accessory device $14_n$ to the accessory device controller 50. The accessory device controller interprets the host controller 82 command signals to activate the switch 66 in the accessory device $14_n$ to couple the bulk power supply voltage to the accessory device power supply 52.

For each additional accessory device $14_1$ through $14_n$ that is plugged into one of the accessory device interfaces $26_1$ through $26_n$, the host controller 82 verifies that the newly plugged in accessory device is a valid and supported device and adds the power draw parameter for that device to the power draw parameters of the accessory devices plugged into the host 12. The summed power draw parameter value is compared to the power budget parameter for the power supply 80 and if the summed value of the power draw parameters is less than the power budget parameter, the host controller will initiate command signals to the accessory device controller 50 to close the switch 66 in the accessory device to couple the bulk power supply voltage to the accessory device power supply 52. If the summed power draw parameters exceed the power budget parameter, the host controller 82 does not initiate the command signals to the accessory device controller 50 to close the switch 66 to couple the bulk power supply voltage to the accessory device power supply 52. The host controller 82 may then generate a signal that causes an indication that bulk voltage has not been applied to the accessory device power supply 52. This indication may be the activation of an LED on the host 12, a graphic display placed on the display device 22 or the like. Alternately, a "STATUS" LED may be provided on the accessory device 14 that is illuminated when power is enabled in the accessory device 14.

Figure 5:
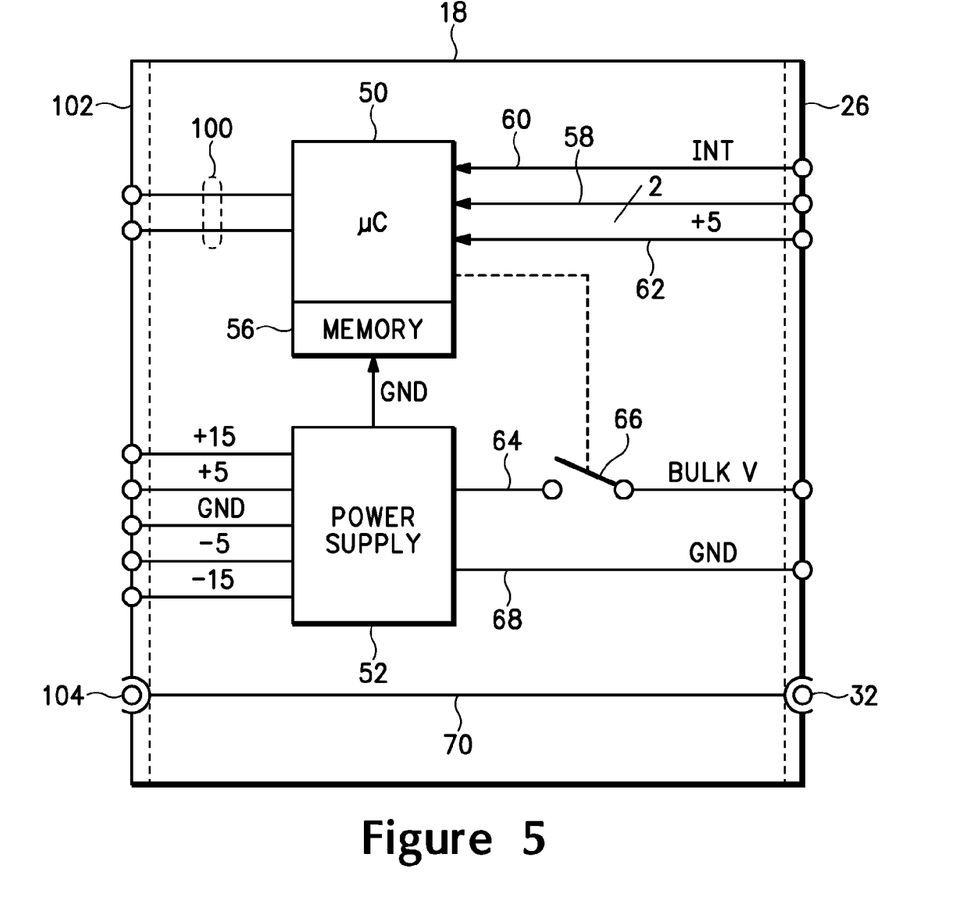
FIG. 5 is a representative block diagram of a measurement probe adapter employing the accessory device voltage management system.

FIG. 5 is a representative block diagram of the measurement probe adapter 18 incorporating the accessory device voltage management system. The measurement probe adapter 18 is used for coupling legacy measurement probes that do not have the accessory device voltage management system. The measurement probe adapter 18 has a controller 50, memory 56 and a power supply circuit 52. The adapter 18 has a communications bus 58, an interrupt line 60 and a low power supply voltage line 62 coupled to the controller 50. The power supply circuit 52 is coupled to a bulk power supply voltage line 64 via a switch 66 and to a ground line 68. The communications bus 58, the interrupt line 60, the low power supply voltage line 62, the bulk power supply voltage line and the ground line are all coupled to the accessory device interface 26. The controller 50 is also coupled to a communications bus 100 that is coupled to a probe interface 102. The probe interface 102 has contact pads that mate with contact pins on a measurement probe coupled to the measurement probe adapter. Such a probe interface is described in U.S. Pat. No. 4,708,661, Titled "Modified BNC Connector for Active Probe." The power supply 52 generates ±15 volts, ±5 volts outputs and a ground connection that are coupled to the contact pads of the probe interface 102. The probe interface 102 also has a BNC connector that mates with a corresponding BNC connector 104 of the measurement probe 20. The signal conductor of the BNC connector is coupled to a signal line 70 in the adapter 18 which is coupled to the BNC connector 32 of the accessory probe interface 26.

The accessory device voltage management system works essentially the same way for the measurement probe adapter 18 as previously described for accessory devices 14 and $14_1$ through $14_n$. The accessory device parameter for the adapter has a power draw parameter that is sufficient to cover any of the measurement probes coupled to the adapter. When the adapter 18 is recognized and validated by the host controller 82 and the bulk power supply voltage is coupled to the power supply circuit 52, the power supply circuit generates the necessary voltages to power the measurement probes coupled to the interface 102. The controller 50 reads parameter data from the attached probe and couples this information to the host controller 82.

An accessory device voltage management system has been described having an accessory device, an accessory device interface and an host. The host receives accessory device parameter data over a bi-directional communications bus and determines if the accessory device is a valid and supported device and compares the power draw parameter of the accessory device with the power budget parameter of the host. If the accessory device is a valid and supported device and the power draw parameter is less than the power budget parameter, the host controller generates command signals that are coupled to the accessory device controller. The accessory device controller initiates the closing of a switch in the accessory device bulk power supply voltage line which couples the bulk power supply voltage of the host to the power supply circuit of the accessory device. The power supply circuit generates voltage outputs for use by accessory device circuitry in the accessory device.

It will be obvious to those having skill in the art that many changes may be made to the details of the above-described embodiments of this invention without departing from the underlying principles thereof. The scope of the present invention should, therefore, be determined only by the following claims.

What is claimed is:

1. An accessory device voltage management system comprising:

an accessory device having a power supply that generates at least a first regulated voltage output, a memory storing parameters of the accessory device, a controller coupled to the memory, a communication bus and an interrupt line coupled to the controller, and a switching element controlled by the controller;

a host having a power supply generating a bulk power supply output and a low power supply output, and a controller coupled to a communications bus and an interrupt line;

and an accessory device interface having a first portion disposed in the host and a second portion disposed in the accessory device with the interface having mating contacts for coupling the bulk power supply output and the low power supply output from the host to the accessory device, coupling a ground connection from the host to the accessory device and coupling the communications bus of the accessory device to the communication bus of the host, wherein the host controller receives an interrupt signal from the accessory device on the interrupt line when the accessory device is coupled to the host via the accessory device interface, with the host controller communicating with the accessory device via the host and accessory device communications busses to retrieve accessory device parameters stored in the accessory device memory to determine if the accessory device is a valid device and supported by the host and initiating communications with the accessory device controller for coupling the bulk power supply of the host to the power supply of the accessory device via the switching element.

2. The accessory device voltage management system as recited in claim 1 wherein the communications bus has a data line and a clock line.

3. The accessory device voltage management system as recited in claim 1 wherein the accessory device power supply generates a plurality of regulated voltage outputs.

4. The accessory device voltage management system as recited in claim 1 wherein the switching element is an electronic switch.

5. The accessory device voltage management system as recited in claim 1 wherein the accessory device comprises a measurement probe.

6. The accessory device voltage management system as recited in claim 1 wherein the accessory device comprises an adapter.

7. The accessory device voltage management system as recited in claim 1 wherein the accessory device parameters include a power draw parameter.

8. The accessory device voltage management system as recited in claim 1 further comprising:

a plurality of accessory devices with each accessory device having a power supply that generates at least a first regulated voltage output, a memory storing parameters of the accessory device, a controller coupled to the memory, a communication bus and an interrupt line coupled to the controller, and a switching element controlled by the controller;

a plurality of accessory device interfaces with each accessory device interface having a first portion disposed in the host and a second portion disposed in one of the plurality of accessory devices with each of the plurality of accessory device interfaces having mating contacts for coupling the bulk power supply output and the low power supply output from the host to the accessory device, coupling a ground connection from the host to the accessory device and coupling the communications bus of the accessory device to the communication bus of the host; and the host controller coupled to the a communications bus having at least a first clock line and a plurality of data lines and a plurality of interrupt lines with the host having a power budget parameter, wherein the host controller receives interrupt signals from the plurality of accessory devices on the interrupt lines when the accessory devices are coupled to the host via the accessory device interfaces, with the host controller communicating with the accessory devices via the host and accessory devices communications busses to retrieve the accessory devices parameters stored in the accessory devices memories to determine if the accessory devices are valid device and supported by the host and total power draw parameters of the plurality of accessory devices are less than the host power budget parameter and initiating communications with the accessory devices controllers for coupling the bulk power supply of the host to the power supplies of the accessory devices via the respective switching elements of the plurality of accessory devices when the accessory devices are valid device and supported by the host and total power draw parameters of the plurality of accessory devices are less than the host power budget parameter.

9. The accessory device voltage management system as recited in claim 8 further comprising a plurality of clock lines with each clock line associated with a data line.

* * * * *